US012698556B2

(12) United States Patent
Leroy et al.

(10) Patent No.: US 12,698,556 B2
(45) Date of Patent: *Aug. 4, 2026

(54) PART COATED WITH A CARBON-BASED LAYER

(71) Applicant: HYDROMECANIQUE ET FROTTEMENT, Andrezieux-Boutheon (FR)

(72) Inventors: Marie-Alix Leroy, Saint-Etienne (FR); Michaël Ougier, Saint Chamond (FR)

(73) Assignee: HYDROMECANIQUE ET FROTTEMENT, Andrezieux-Boutheon (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/686,079

(22) PCT Filed: Aug. 31, 2022

(86) PCT No.: PCT/FR2022/051642
§ 371 (c)(1),
(2) Date: Feb. 23, 2024

(87) PCT Pub. No.: WO2023/031558
PCT Pub. Date: Mar. 9, 2023

(65) Prior Publication Data
US 2024/0352571 A1 Oct. 24, 2024

(30) Foreign Application Priority Data

Aug. 31, 2021 (FR) ...................................... 2109116

(51) Int. Cl.
C23C 14/06 (2006.01)
C23C 14/02 (2006.01)
(Continued)

(52) U.S. Cl.
CPC ........ *C23C 14/0605* (2013.01); *C23C 14/025* (2013.01); *C23C 14/35* (2013.01);
(Continued)

(58) Field of Classification Search
None
See application file for complete search history.

(56) References Cited

U.S. PATENT DOCUMENTS

2005/0118426 A1* 6/2005 Miyake ................... F01L 1/205
428/408
2007/0292711 A1* 12/2007 Ueno ...................... C23C 16/26
428/688
(Continued)

FOREIGN PATENT DOCUMENTS

EP 2811049 A1 12/2014
EP 3699315 A1 8/2020
(Continued)

OTHER PUBLICATIONS

Robertson, J., "Diamond-like amorphous carbon", 2002, Materials Science and Engineering R, vol. 37, pp. 129-281 (Year: 2002).*
(Continued)

*Primary Examiner* — Seth Dumbris
(74) *Attorney, Agent, or Firm* — HESLIN ROTHENBERG FARLEY & MESITI P.C.

(57) ABSTRACT

The invention relates to a metal part comprising a metallic substrate (S) having an outer surface coated with a layer of carbon-based material (M). According to the invention, the layer of carbon-based material: —is of "DLC" amorphous carbon type, from the a-C family; • comprises less than 3 at % of oxygen within the layer of carbon-based material; • does not contain hydrogen, nitrogen, or doping elements.

19 Claims, 7 Drawing Sheets

(51) Int. Cl.

| | | |
|---|---|---|
| *C23C 14/35* | (2006.01) | |
| *H01M 4/86* | (2006.01) | |
| *H01M 4/88* | (2006.01) | |
| *H01M 8/0206* | (2016.01) | |
| *H01M 8/021* | (2016.01) | |
| *H01M 8/0213* | (2016.01) | |
| *H01M 8/0228* | (2016.01) | |
| *H01M 8/10* | (2016.01) | |

(52) U.S. Cl.

CPC ....... *H01M 4/8631* (2013.01); *H01M 4/8657* (2013.01); *H01M 4/8663* (2013.01); *H01M 4/8871* (2013.01); *H01M 8/0206* (2013.01); *H01M 8/021* (2013.01); *H01M 8/0213* (2013.01); *H01M 8/0228* (2013.01); *H01M 2004/8694* (2013.01); *H01M 2008/1095* (2013.01); *H01M 2250/20* (2013.01)

(56) References Cited

U.S. PATENT DOCUMENTS

| | | | | |
|---|---|---|---|---|
| 2012/0094074 A1* | 4/2012 | Suzuki | ................... | C23C 16/26 |
| | | | | 428/688 |
| 2013/0140776 A1* | 6/2013 | Kennedy | ................ | C23C 16/44 |
| | | | | 427/299 |

| | | | | |
|---|---|---|---|---|
| 2015/0292622 A1* | 10/2015 | Kennedy | ................... | F16J 9/26 |
| | | | | 277/442 |
| 2016/0240865 A1 | 8/2016 | Hirano et al. | | |
| 2017/0253825 A1* | 9/2017 | Tsuji | ....................... | C01B 32/26 |

FOREIGN PATENT DOCUMENTS

| | | | |
|---|---|---|---|
| JP | 2012007199 A | * | 1/2012 |
| WO | 2007/136131 A1 | | 11/2007 |
| WO | 2011/077755 A1 | | 6/2011 |
| WO | 2013/114836 A1 | | 8/2013 |
| WO | 2013/124690 A1 | | 8/2013 |
| WO | 2020/019693 A1 | | 1/2020 |

OTHER PUBLICATIONS

International Search Report and Written Opinion of International Application No. PCT/FR2022/051642, mailed on Dec. 13, 2022, 15 pages. Full translation.

Teer, "Technical Note: a Magnetron Sputter Ion-Plating System," Surface and Coatings Technology, 1989, vol. 39-40: pp. 565-572.

Leroy et al., U.S. Appl. No. 18/686,184, filed Feb. 23, 2024.

* cited by examiner

60

60

PART COATED WITH A CARBON-BASED LAYER

CROSS REFERENCE TO RELATED APPLICATIONS

This application is a national stage filing under section 371 of International Application No. PCT/FR2022/051642, filed on Aug. 31, 2022, and published on Mar. 9, 2023, as WO 2023/031558, which claims priority to French Application No. 2109116, filed on Aug. 31, 2021. The entire contents of WO 2023/031558 are hereby incorporated by reference herein.

TECHNICAL FIELD

The invention relates to the technical field of coatings for fuel cell or electrolyser electrodes.

PRIOR ART

The invention relates to electrochemical systems, such as fuel cells and electrolysers, and in particular, proton exchange membrane fuel cells (PEMFC).

The operation of these electrochemical systems involves an acid or basic environment, oxidising to the cathode, a temperature being able to be from 60 to 160° C., and the optional presence of halides. This environment favours the corrosion of the elements of said system, such as interconnecting plates, also called electrodes, interconnectors or bipolar or monopolar plates.

In particular, bipolar plates are one of the critical components for the durability of these systems: they are constituted of metal sheets, the thickness of which is around 100 μm. They must be protected by a coating, in order to preserve a sufficient electrical conduction on the surface, to minimise the electrical losses at the interfaces, and in order to avoid the corrosion of metal sheets in the aggressive medium of the cell.

The surface conduction of a bipolar plate made of metal material, including in a corrosive medium, is generally obtained by depositing a carbon- or gold-based functional layer on the extreme surface of a substrate. In the case of carbon layers, the prior deposition of a sublayer on the substrate can improve the adherence of the functional layer and ensure the mechanical resistance of the stack.

Generally, the adherence between the layer and the substrate, as well as the mechanical strength of the functional layer, which is conveyed by an absence of damage by cracking or by delamination, are important parameters.

Indeed, the barrier function of this layer must not be degraded over the operating duration of the electrochemical system, to protect the metallic substrate from oxidation, in order to prevent the emission into the medium of the cell of metal cations coming from the substrate, even in a low quantity.

Local and generally temporary variations of the conditions of the electromechanical system increasingly urge the functional layer, within which defects such as lacks, cracks, holes, intercolumn spaces, can cause a rapid degradation of the substrate, in particular by galvanic coupling with the functional layer.

Furthermore, when the membrane of the cell is made of fluoropolymer, it can release fluoride $F^-$ ions which together promote corrosion by pitting of the stainless steel substrates. This can then lead to a rapid and catastrophic failure of the entire cell.

In order to protect a cell from such failures, by meeting the mechanical strength and electrical conduction objectives described above, it is known from the prior art to deposit a functional layer, in particular carbon-based.

The physical vapour deposition (PVD) of carbon is characterised by the option of obtaining a wide range of materials with properties which can widely differ, including when this is only carbon deposition, for example by playing on the proportions of hybridised atoms sp2 with respect to the hybridised atoms sp3, it is possible to obtain properties which are very different from one another to use. So as to improve the features of the deposited layer, generally additional energy is provided during the deposition. It is also possible to put larger or smaller proportions of hydrogen within the carbon layer.

Document WO2020019693A1 describes the deposition of a carbon-based functional layer, during which the substrate is heated to a high temperature, i.e. between 400 and 500° C., in order to obtain a partial recrystallisation of the deposition in the form of graphite. However, the heating of the parts increases the duration of the treatment, as well as the energy cost.

Good performance has also been obtained by adding other elements to the carbon. Thus, document WO2011077755 describes a bipolar plate for a fuel cell coated with a carbon-based functional layer, doped with nitrogen with a content of between 3 and 20 at %, and with hydrogen with a content greater than 0% and less than or equal to 20 at %.

Document WO2007136131 describes a conductive member provided with an amorphous carbon layer, doped with silicon at a content of less than 1 at %, and containing hydrogen with a maximum content of 30 at %.

Document WO2013114836 describes an amorphous carbon layer containing hydrogen, nitrogen and oxygen with maximum contents of 30, 20 and 3 at %.

However, controlling the contents of additional elements burdens the method and makes the treatment more expensive.

A difficulty finally resides in the contradiction between having the thinnest layer possible, such that its deposition is rapid, and the durability lower than a thin layer has, which will be degraded more rapidly.

The methods and products described in documents WO2013124690, the article D. G. TEER "Technical note: a magnetron sputter ion-plating system", SURFACE AND COATING TECHNOLOGY, vol. 39/40 (1989 Dec. 1) p. 565-572, and US20160240865 are not entirely satisfactory.

An aim of the invention is therefore to overcome the disadvantages of the prior art described above.

To this end, the invention first aims to propose a carbon coating, the intrinsic features of which are optimal to ensure a high performance for electrodes, for example, fuel cells.

The invention also relates to a part adapted for particular applications of fuel cells, which is efficient and inexpensive.

The invention then relates to a deposition method, making it possible to obtain such a carbon coating.

The invention finally aims to propose a method for optimising a deposition with assistance of a carbon layer, which can be adapted to the largest number possible of deposition techniques.

DISCLOSURE OF THE INVENTION

To this end, a metal part has been developed, comprising a metallic substrate having an outer surface coated with an outer layer of carbon-based material, i.e. that the carbon-based material layer constitutes the exposed surface of the part.

According to the invention, the layer of carbon-based material:

is of "DLC" amorphous carbon type, from the a-C family;

comprises at most 3 at % of oxygen within the carbon-based material layer;

does not contain hydrogen, nitrogen, or doping elements.

In this way, the carbon-based layer has the optimal intrinsic features to ensure a high performance for electrodes. Its manufacture is facilitated and inexpensive, as it does not comprise any addition elements.

By "contains no hydrogen, nitrogen, or doping elements", this means that these elements are not intentionally added in the deposited layer, and can only be present in an insufficient quantity to give particular properties to the deposited layer. Preferably, these elements are only present as traces.

In the case of particular use within a fuel cell, the part forms part of a plate of the monopolar or bipolar type for a fuel cell. In this case, the part satisfies the requirements of the DOE.

Advantageously, the metal part comprises a carbon-based sublayer being located between the substrate and the carbon-based material, in contact with said carbon-based material, the carbon sublayer comprising between 3 at % and 15 at % of residual oxygen. In this way, the adherence of the material layer on the substrate is improved.

So as to give a sufficient adherence, but without involving an increase which is too consequential of the deposition duration (and therefore, the cost of the part), the thickness of the carbon-based sublayer is between 2 nm and 40 nm, preferably between 10 nm and 30 nm.

The invention also relates to a method for optimising a deposition, with ion assistance, of a carbon-based material outer layer on a metallic substrate, the deposition being done according to one of the techniques from among:

magnetron sputtering, continuously or pulsed, high power impulse magnetron sputtering (HiPIMS), unbalanced configuration magnetron sputtering, and optionally in a closed field, RF sputtering, or any combination which can be done from these techniques.

According to the invention, the method consists of determining the level of assistance for which the carbon-based material layer contains at most 3 at % of oxygen within the carbon-based material layer.

In this way, the deposition methods make it possible to obtain a carbon-based layer having the abovementioned advantageous features.

Naturally, there can be several levels, or a range of levels, which make it possible to obtain the desired oxygen content.

The invention also relates to, once the assistance level is determined, deposit with ion assistance, a carbon-based material layer on a metallic substrate, the deposition being done according to one of the techniques from among:

magnetron sputtering, continuously or pulsed, high power impulse magnetron sputtering (HiPIMS), unbalanced configuration magnetron sputtering, and optionally in a closed field, radiofrequency sputtering ("RF" sputtering), or any other combination which can be done from these techniques.

According to the invention, the deposition is done with an ion assistance, the level of which has been adjusted, such that the carbon-based material layer contains at most 3 at % of oxygen within the carbon-based material layer.

It is indeed after having proceeded with numerous deposition tests (with different PVD technologies) and resistance tests of the layers obtained by different techniques that the Applicant has observed, that common feature making it possible to obtain satisfactory performance, is the residual oxygen content, which must be low within the carbon layer.

Indeed, the correct implementation of the invention makes it possible to minimise the oxygen content in carbon-based depositions of the prior art, as, as a minimum in PVD equipment in a good condition, the oxygen can come from the residual vacuum, or from the carbon target, which is always porous (the porosity reaches, as a minimum, 10% of the volume of the target).

Yet, in the case of an industrial method, the removal of the oxygen of a deposition is not a given, as generally an industrial method is requested, that it has a high productivity and that it does not therefore take too much time. But, during putting a chamber under vacuum, the steam is more difficult to pump, because it is adsorbed strongly at the surfaces. The complete removal of the steam would take a lot of time, even if the chamber was heated. Generally, there is always residual steam within the chamber, which is conveyed by little oxygen and hydrogen in the depositions.

In the scope of optimising the deposition, the invention therefore integrates the determination of the oxygen content, for example by EDX characterisation of the deposition after a calibration of the EDX measurement specifically to ensure the quality of the dosing of the oxygen with respect to the carbon.

The method is compatible with several deposition techniques, which makes it possible for the manufacturer of parts to select the technique which is suitable for them, according to the material that they have, of their expertise with certain materials, or also for economic reasons.

Ion assistance, which consists of bombarding the carbon layer by ions, during its growth, is one of the effective means to reduce the oxygen quantity in this layer. Ion assistance can be, for example:

an ion bombardment obtained by open field lines generated by using an unbalanced magnetron sputtering (UBMS), an ion bombardment obtained by excitation by radio frequency of a plasma confined in the proximity of the part, an ion bombardment obtained by a plasma generated, for example, by microwaves.

Adjusting assistance means modifying the assistance parameters with respect to the parameters of the deposition, so as to find a balance between the additional energy provided and the quantity of material deposited during the deposition:

an insufficient energy provision does not make it possible to prevent oxygen from being incorporated in the carbon-based material layer; and an excessive energy provision degrades the structure of the carbon-based material layer, such that the oxygen present in the treatment chamber is reabsorbed by the layer being formed. Moreover, an excessive energy provision heats more parts, and therefore indirectly, the chamber. This generates more water desorption of the walls, and therefore more oxygen in the deposition.

In practice, adjusting the assistance can come down to:

modifying the intensity of the assistance, for example by adjusting the bias or the density of auxiliary plasma;

modifying the durations of use of an alternative function-
    ing assistance or a pulsed sputtering (illumination dura-
    tion and/or extinction duration to modify the Ton/Toff
    ratio);
    using, in a combined manner and/or alternatively, several
        assistance modes.
Measuring the residual oxygen content makes it possible to
determine the optimum assistance.
    Determining the assistance level necessary with respect to
the deposition therefore consists of performing several series
of depositions, with differently adjusted assistance levels,
then proceeding with measuring the residual oxygen content
within the carbon-based material layer, in order to only
retain the assistance levels making it possible to obtain the
desired contents.
    In the case of an ion assistance, it is reminded that it is
characterised by the quantity of ions directed toward the
growth material layer, as well as by the energy of these ions.
The flow of ions is directed toward the substrate and the bias
of the latter accelerates the flow of ions. These interactions
between the ions and the substrate occur in the proximity of
the substrate.
    The ions which bombard the growth layer come from the
magnetron cathode (for example, in the case of an unbal-
anced magnetron cathode sputtering), and when a comple-
mentary plasma source is present, from the magnetron
cathode and mainly said complementary plasma source.
    The flow of ions therefore comprises the ions from the
gaseous mixture, wherein the plasma is generated, such as
argon ions for example, and optionally ions coming from the
target. Whatever the nature of the ions, they bombard the
growth layer, which makes it possible to densify the depo-
sition and to adjust the oxygen quantity.
    The ion assistance is not necessarily simultaneous to the
cathode sputtering. They can operate alternately, such that:
    the substrate receives a first quantity of carbon-based
        material by sputtering,
    then the ion assistance is implemented to densify the
        deposited material.
    The substrate thus passes in front of the carbon source
then in front of the ion source, repeatedly.
    The alternances are chosen according to the cathode
sputtering method and according to the design of the instal-
lation implementing the deposition method. In practice, the
sputtering and ion assistance systems can operate continu-
ously, while the part to be coated scrolls successively in
front of said systems. Clearly, it is considered that when the
ion assistance is implemented, the associated flow of ions is
always greater than zero, i.e. that the flow of ions is
non-zero, otherwise the ion assistance could not fulfil its
role.
    The flow of neutral carbon atoms (on) is oriented from the
target to the substrate. It mainly comprises carbon atoms,
constituting the material layer to be deposited, coming from
the target.
    The carbon-based material layers being thin, typically less
than 500 nm thick, even sometimes less than 100 nm, and
the residual oxygen rate being low, measuring the residual
flow cannot be done in situ, during the deposition. There-
fore, a series of depositions must be made according to a
pre-established experiment plan, and to then measure the
residual oxygen rates obtained according to the different
deposition parameter torques and assistance parameters, so
as to achieve a residual oxygen rate less than or equal to 3
at %.
    The bias voltage of the substrate, or more simply, the bias
of the substrate, is defined as being the potential difference applied between the substrates and the ground of the device
implementing the method. This bias can be continuous or
pulsed. In the latter case, the bias voltage is the average
value of the voltage applied to the substrates. The bias
current is the (average) intensity measured on the biased
substrate.
    The (kinetic) energy of the ions is given to them by the
acceleration in the electrical field which is around the
substrates. It is linked to the bias voltage and is calculated
by multiplying the absolute value of the potential difference
between the substrate and the plasma by the electrical charge
of the particle or of the species considered. Generally, it is
considered that the potential of the plasma with respect to
the ground is insignificant before the potential difference
between the ground and the parts. This returns to consider-
ing that the energy of the monocharged ions in eV corre-
sponds to the voltage delivered by the bias generator in
volts.
    Always in this case, also preferably, for reasons of opti-
mising the method, the deposition can be performed in a
chamber under controlled atmosphere, and the working
pressure of which is between $0.8 \times 10^{-3}$ mbar and $8 \times 10^{-3}$
mbar, preferably between $1.5 \times 10^{-3}$ mbar and $4 \times 10^{-3}$ mbar,
and even more preferably between $2.0 \times 10^{-3}$ mbar and $2.6 \times 10^{-3}$ mbar.
    For the protection of the substrate to be sufficient in case
of operating incidents or local variations of operating param-
eters, in particular in case of overpotentials linked to tran-
sitional or accidental systems for operating the electro-
chemical system, the material deposited on the substrate
forms a layer called thin layer, having a thickness greater
than or equal to 20 nm, preferably of between 20 nm and 500
nm, more preferably between 50 nm and 250 nm, even more
preferably between 80 nm and 150 nm, and more preferably
between 80 nm and 120 nm.
    In a first embodiment, the flow of ions (of ion assistance)
is generated by a magnetron cathode, for example when the
method consists of an unbalanced magnetron cathode sput-
tering.
    In a second embodiment, the flow of ions is generated by
a system complementary to the magnetron cathode, prefer-
ably by microwave plasma.
    With an aim of equipment productivity and rationalisa-
tion, and optionally, the substrate scrolls within an installa-
tion in front of a magnetron cathode sputtering station, then
in front of a plasma generation station, preferably cyclically.
    In order to improve the adherence of the carbon-based
material deposited on the substrate, and to protect the
substrate from a possible oxidation, the method can com-
prise a prior step of depositing a metal sublayer on the
substrate, intended to be located between the substrate and
the carbon-based material, in contact with said substrate, the
material of the metal sublayer being chosen from among one
or more of the following materials: chromium, titanium,
zirconium, tantalum, or their alloys, as well as their nitrides
and carbides, and preferably titanium or tantalum, or their
alloys (alloys comprising titanium and/or tantalum), as well
as their nitrides and carbides.
    In order to have a favourable compromise between the
duration of depositing the metal sublayer and the improve-
ment of the adherence that it gives, its thickness is between
5 nm and 100 nm, preferably between 20 nm and 40 nm.
    In order to improve the adherence of the carbon-based
material deposited on the substrate, the method can com-
prise a prior step of depositing a carbon-based sublayer on
the substrate, intended to be located between the substrate and the carbon-based material described above, said sublayer being in contact with said carbon-based material.

The carbon-based sublayer is preferably constituted of the same material as the overlying layer of carbon-based material. The choice of carbon as the material of the sublayer makes it possible to only use one single sputtering target within the magnetron, which therefore makes it possible to simplify the implementation of the method.

To perform the deposition of the carbon-based sublayer, the deposition with a moderate ion assistance is proceeded with, insufficient for expelling oxygen from the carbon-based material during deposition. A carbon-based sublayer therefore comprises a residual oxygen rate greater than 3 at %, and less than 15 at %, preferably between 5 at % and 10 at %.

The carbon-based sublayer can have an oxygen content gradient, decreasing from the substrate in the direction of the carbon-based material, such that the limit between the sublayer and the layer is the level where the residual oxygen content reaches the threshold defined by the invention.

The implementation of the method according to the abovementioned features and comprising a step of a carbon-based material from a target onto a metal substrate by magnetron cathode sputtering, therefore enables the functionalisation of a monopolar or bipolar plate comprising said metal substrate covered by a layer comprising said carbon-based material, for example by ensuring a durable protection against the corrosion of a bipolar plate, while maintaining, over time, a high surface electrical conduction level.

In a particular embodiment adapted to the field of fuel cells, the substrate comprises a stainless steel, titanium, a titanium alloy, or a nickel-, chromium- and iron-based alloy, which is preferably an Inconel®.

Preferably, the substrate is a plate of thickness of between 10 µm and 1000 µm.

A part according to the invention comprises a carbon-based material layer which has very good features, in particular of conductivity and resistance to corrosion.

Preferably, such a part forms part of a plate of the monopolar or bipolar type for a fuel cell, as it has the technical features ensuring it durability and sufficient performance to satisfy the requirements of the field of fuel cells.

DETAILED DESCRIPTION OF THE INVENTION

In the field of vacuum depositions, there are several types of technologies, and each has its advantages and its disadvantages. In the scope of treating parts, and in particular, monopolar or bipolar plates for the fuel cells, the Applicant has sought to optimise known deposition methods.

Based on the known and industrialisable technology of ion-assisted magnetron cathode sputtering deposition, the Applicant has performed different series of tests and interpretations aiming to obtain a deposition of a carbon-based material (M), forming a layer on a substrate (S), and having good properties, in particular, of mechanical strength, resistance to corrosion, adherence, and electrical conduction.

Figure 1:
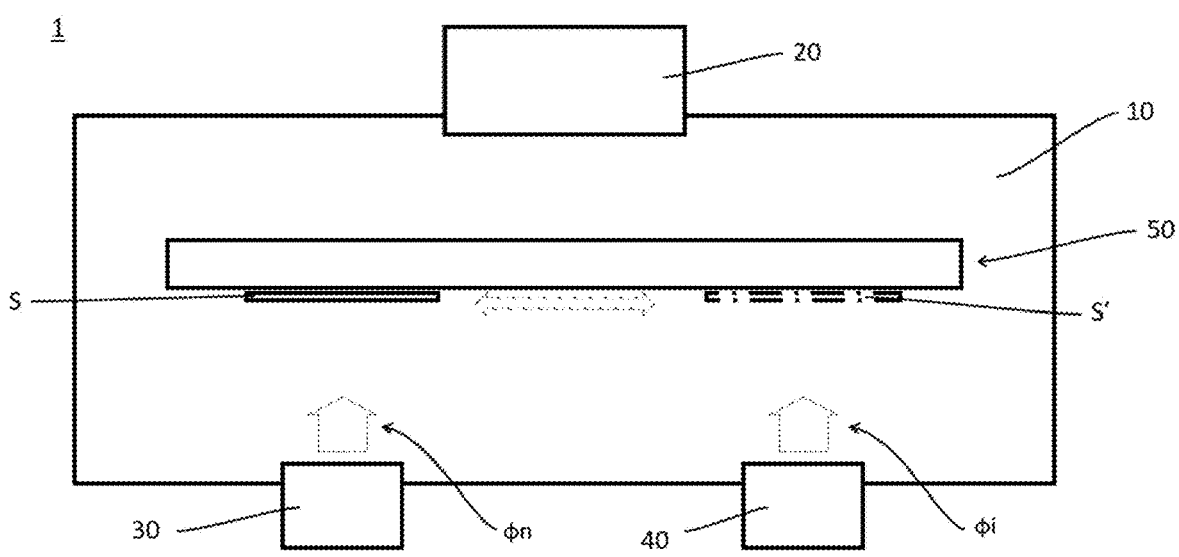
FIG. 1 is a schematic representation, as a top view, of an installation for the implementation of the method according to the invention.
Figure 2:
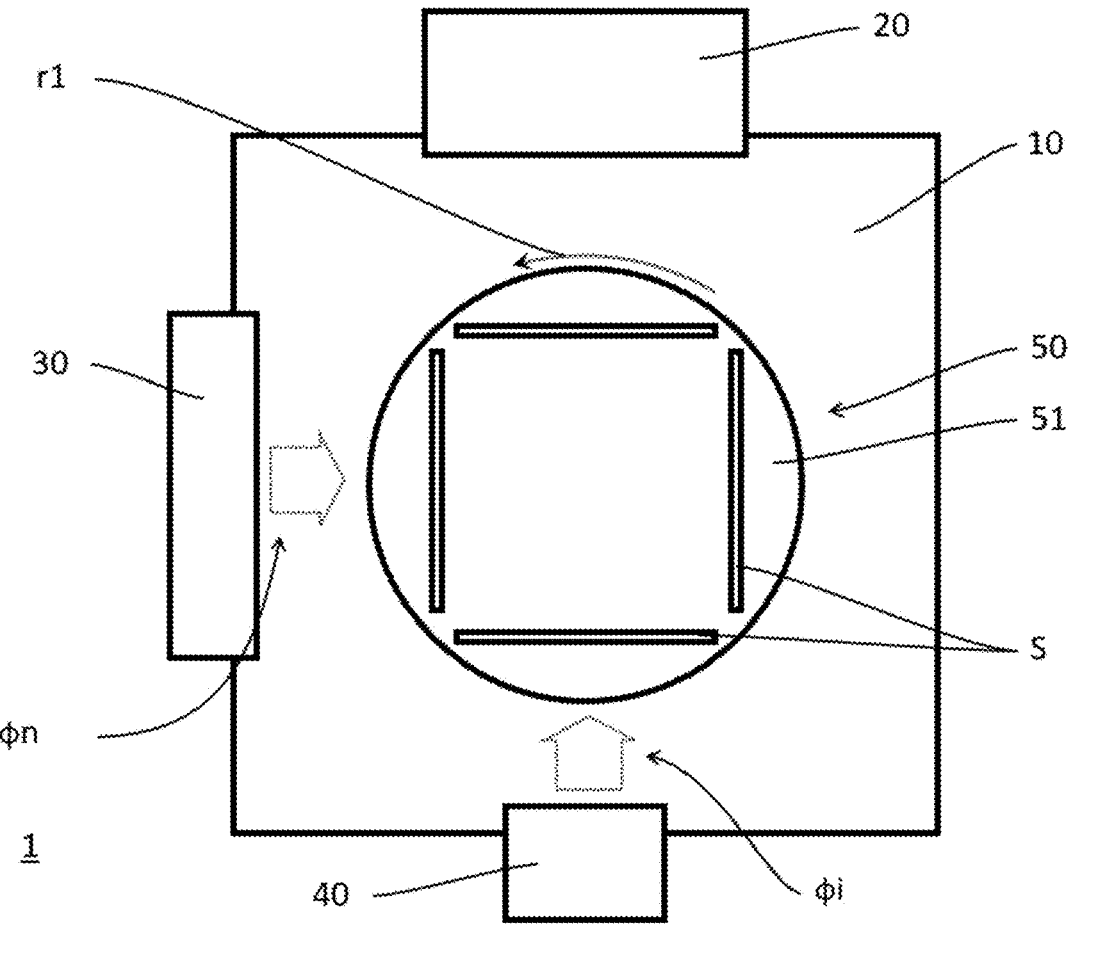
FIG. 2 is a schematic representation, as a top view, of another installation for the implementation of the method according to the invention.

In reference to FIGS. 1 and 2, the installation (1) used to implement a preferred embodiment of the method comprises a secondary vacuum chamber (10), provided with a pumping system (20), a conventional (balanced or unbalanced) magnetron sputtering source (30), a complementary plasma source (40) generating a gaseous ion plasma (P), and a substrate carrier (50) on which the substrates (S) to be treated are mounted.

The pumping system (20) makes it possible to obtain a secondary vacuum in the chamber (10), i.e. a pressure of an order of magnitude of between $10^{-7}$ mbar and $5 \times 10^{-5}$ mbar. The pumping system (20), or another independent system, is capable of introducing a gas (rare gas) in the vacuum chamber (10). The gas is intended to be ionised, this is preferably argon.

The magnetron sputtering source (30), is a conventional magnetron (30), supplied continuously. In this embodiment, the assistance ions are mainly generated by a plasma source (40) complementary to the magnetron cathode (30). The plasma source (40) is of any suitable type, but the plasma (P) is preferably generated by microwaves.

In other embodiments, the ions are generated by the magnetron cathode (30), in particular in the cases where the magnetron is unbalanced. An unbalanced magnetron has an unbalanced magnetic structure, which makes it possible to send some of the ions generated by the plasma of the cathode to the parts.

The plasma source (40) is therefore optional and its presence depends on the type of magnetron sputtering implemented and on the quantity of ions available to generate a sufficient flow of ions ($\varphi i$) on the growth deposition.

In any case, it is possible to add several magnetron cathodes (30) to deposit the material (M) quicker on the substrate (S), in which case, each cathode is supplied by its own generator.

The substrate carrier (50) is biased, i.e. that a negative voltage or potential difference is applied at its terminals, in order to accelerate the gaseous ions of the plasma and thus create a flow of ions ($\varphi$i) in the direction of the substrate carrier (50). This acceleration of the gaseous ions occurs in the vicinity of the substrates (S), since the electrical field which results from the biasing of the parts extends over a short distance, of around 1 mm to 3 mm.

Whatever the sputtering mode considered, ions are attracted onto the material (M) target of the magnetron, in order to sputter it and emit the atoms which form the deposition on the substrate (S). It is not these ions which the Applicant is interested in, in the present invention. Indeed, these are the ions attracted onto the substrate (S), where the material (M) deposition grows which define the ion assistance, and which are important for the quality of the deposited layer. In the scope of this embodiment, the ions are constituted of gaseous species, preferably like argon.

The role of these ions is to bombard the material (M) deposition by growth on the substrate to compact it and remove the species not forming sufficiently stable bonds with the atoms of the material. This makes it possible to increase the density of the growth material (M) layer, and to remove the oxygen in said growth material (M) layer. Care must however be taken, to not eject the material (M) already placed on the substrate (S), in order to not slow down the deposition or degrade the quality of the current deposition, nor overheat the substrates.

Generally, the ions of the plasmas coming from the magnetron cathodes or auxiliary plasma sources of the microwave plasma type are "slow". They therefore have no power to compact a growth material (M) layer or remove oxygen from this layer. Thus, and as indicated above, a negative voltage is applied to the substrate (S) to be coated, which attracts and accelerates the positive ions to said substrates (S).

In the case of biasing a substrate (S) in a plasma (P), the bias voltage is applied between the substrates (S) and the ground of the installation (1). A potential difference is established between the substrates (S) and the plasma (P). It is in this potential drop zone, over around 1 to 3 mm of the surface of the substrates (S), that the ions are accelerated.

The kinetic energy of the ions is similar to the potential difference between the plasma (P) and the substrates (S). In most plasmas, the potential of the plasma is known, but it is generally a few Volts, for example, +5V to +10V. In practice, the potential of the plasma (P) is similar to 0V when the voltage applied to the substrates (S) reaches a few tens of volts as an absolute value.

This approximation is valid at low pressure, as the ions are not slowed down by collisions in the acceleration phase in the proximity of the substrates (S).

The acceleration of these ions being proportional to their charge and to the potential difference, the bias voltage is assimilated to the energy given to the ions during the deposition, by multiplying this bias voltage by the charge of an electron. Indeed, in the technical field considered, the ions are generally monocharged.

In the installation (1) illustrated in FIG. 1, the substrate carrier (50) is of the carriage type, i.e. that it comprises a linear actuator to drive a substrate (S) in translation and alternatively in front of the magnetron (30) in order to receive the material (M), then in a position (S') in front of the plasma source (40) such that the impacts of gaseous ions compact the deposited material (M) layer. In this case, the installation is disposed by length.

In the installation (1) illustrated in FIG. 2, the substrate carrier (50) is of the revolving type, i.e. that it comprises a plate (51) on which one or more substrates (S) are disposed, and this plate (51) is driven in a rotation (r1). In this way, each substrate (S) scrolls alternatively in front of a magnetron cathode sputtering station, then in front of a plasma generation station (P).

According to the exact implementation and the size of the substrates, additional rotations can, naturally, be superposed to the rotation (r1) of the plate.

In each of these embodiments, it is advantageous to dispose several magnetron cathodes (30) alternately with several plasma sources (40). In this way, the movement of the substrate (S) is continuous, and this scrolls alternatively in front of a magnetron cathode sputtering station, then in front of a plasma generation station (P). Adding magnetron cathodes (30) alternately with plasma sources (40) makes it possible to increase the productivity of the installation (1).

In any case, the substrate carrier (50) can be of any suitable type according to the substrates (S) to be treated or to the construction of the installation (1), this also being able to be disposed vertically or horizontally or adapted by shape and by dimensions.

In order to be able to evaluate the performance of the material (M) layer deposited on the substrate (S), the following measurements are taken.

The service life of the deposited material (M) layer is evaluated by making it undergo an electrochemical corrosion test.

The electrochemical tests are performed in an acid solution of pH equal to 3 ($H_2SO_4$), at 80° C. and with 0.1 ppm of fluoride ion. These parameters are defined by the DOE (Department Of Energy) in the United States of America to simulate the operating medium of a PEMFC. The potential is set to +0.8V on the working electrode on which the material to be tested is mounted, with respect to the reference electrode Ag/AgCl. The potential used is greater than what is recommended by the DOE (0.6V) in order to tighten up the test and to only select the best depositions. The addition of an air bubble makes it possible to simulate the cathode behaviour of a fuel cell.

The corrosion current is an image of the degradation speed of a part comprising a substrate (S) having received a material (M) layer. Indeed, the greater the corrosion current is, the more the part is in the process of being oxidised, i.e. that the material (M) layer poorly fulfils its protective role (it can itself be oxidised and be consumed). In practice, a corrosion current density less than 300 $nA/cm^2$ after 24 hours under a potential of 0.8V is considered acceptable.

The surface conductivity of the coating is evaluated by the measurement of its interfacial contact resistance, or "ICR". A coating having a good surface conductivity has a low ICR, for example less than 10 $m\Omega \cdot cm^2$.

The ICR measurement is taken on a stack composed of a Copper-Carbon Sheet block (GDL—Gas Diffusion Layer)-Deposition on substrate-Nickel paint (rear face of the substrate)-Copper block, on which a current of 100 mA is applied for a surface area of 1 $cm^2$, then the resistance of the assembly is calculated from the voltage measured.

This stack is representative of the contact between a coated bipolar plate and the GDL. A pressure of 138 $N/cm^2$ is applied on this by a lever arm system with weights, this pressure being representative of that applied on an electrochemical cell during its assembly.

The resistance $R_{total}$ obtained is the sum of (equation 1):

Of the resistance of the Cu—Cu system ($R_{offset}$)

Once the Copper Carbon $R_{Cu/C}$ interfacial contact resistance

Once the resistance of the Carbon RC felt (zero)

Of the interfacial contact resistance between the deposition and the Carbon $R_{C/deposition}$.

Of the linear resistance of the deposition $R_{deposition}$

Of the resistance of the 316 L $R_{316L}$ steel platelet (zero)

Once the Nickel Copper $R_{Ni/Cu}$ interfacial contact resistance

[Math. 1]

$$R_{total} = R_{offset} + R_{Cu/C} + R_{C/deposition} + R_{deposition} + R_{Ni/Cu} \qquad (1)$$

The ICR is determined using the equation (2).

[Math. 2]

$$R_{C/deposition} + R_{deposition} = RCI = R_{total} - R_{offset} - R_{Cu/C} - R_{Ni/Cu} \qquad (2)$$

The ICR can be measured before or after a corrosion test, in which case the latter simulates an accelerated ageing of the treated parts.

Complementarily to the corrosion resistance, it is relevant to be interested in the surface conductivity of the coated substrates (S). Indeed, a substrate (S) coated with a metal sublayer (SC) then a carbon layer can have a good corrosion resistance, which can be explained in certain cases by a passivation of the material of the sublayer (SC) in case of degradation of the carbon layer. However, this passivated material is not conductive enough on the surface, which means that a bipolar plate functionalised with such a deposition protects a fuel cell from an accidental degradation, however the performance of this fuel cell would be less (low yield due to significant ohm losses). The cumulative consideration of these two parameters is therefore necessary.

As needed, it is possible to make cuts of the samples, for example, by ion beam (focused ion beam—FIB) in order to observe the morphology of the deposited layer.

Within the installation (1), several series of tests have been performed. The substrates (S) used are stainless steel test pieces 316 L intended to be coated on their two faces, in order to simulate the coating of bipolar plates.

The substrate (S) is positioned on a mounting, it is cleaned and blasted to remove the contaminants and dust possibly present on its surface. It is then introduced into a vacuum deposition installation (1).

The pumping system (20) is activated, such that the pressure in the chamber (10) is less than $5 \times 10^{-6}$ mbar, and the chamber (10) is heated to remove the water adsorbed on its walls.

The surfaces of the substrate (S) to be coated are heated and bombarded to remove the water adsorbed on the surfaces and strip the chromium oxide layer present on the surface.

The pumping system (20) then introduces argon into the chamber (10), such that there is an argon pressure of $2.5 \times 10^{-3}$ mbar. Argon is used in order to be ionised, and is not intended to be contained in the carbon-based layer.

A carbon-based sublayer (SC) is deposited on the substrate (S) by means of the magnetron cathode (30), in order to guarantee the good adherence of the carbon-based material (M) layer. During the deposition of the sublayer (SC), the ion assistance is low, in particular it does not expel oxygen so as to obtain a residual oxygen content less than 3 at %.

12

Then an auxiliary plasma source (40) is illuminated in order to generate a sufficient flow of ions ($\varphi$i). The plasma source (40) is maintained at a power of 400 W. The rest of the deposition is performed with an alternating sputtering of the target on the magnetron cathode (30) and of ion bombardment by the plasma source (40), over a total duration of 25 minutes.

With this first example, a 100 nm carbon layer is thus obtained on the two faces of the substrate (S). The chamber (10) is then vented and the substrate (S) is recovered.

A first series of tests is performed by modifying:

the deposition durations which provides a more or less thick deposited layer;

the power of the ion assistance; and the presence or not of a sublayer (SC) making it possible to improve the resistance of the material (M) layer on the substrate (S).

The power applied to the magnetron cathode (30), therefore the deposition speed, remains constant. The compliance of the tests is evaluated by measuring the ICR and by the resistance to the corrosion of the deposited layers.

The results obtained are indicated in the table below. The oxygen contents are rounded up, as this corresponds to the resolution of the measurement by EDX.

TABLE 1

| Test | Metal sublayer | Power on the ancillary plasma source (W) | Corrosion current density (nA/cm$^2$) | at %. Oxygen (measured by EDX) | Performance |
|------|----------------|------------------------------------------|---------------------------------------|-------------------------------|-------------|
| Example 1 | No | 0 | 1050 | 8 | Insufficient |
| Example 2 | No | 200 | 470 | 5 | Insufficient |
| Example 3 | No | 400 | 200 | 2 | Excellent |
| Example 4 | No | 1000 | 550 | 4 | Insufficient |

The performance is obtained by validating resistance to corrosion and low ICR criteria of the deposited layer, such as they are described in detail below.

This table shows that the low oxygen content within the carbon-based material (M) layer makes it possible to satisfy the expected criteria. The presence of a metal sublayer, as well as the thickness of the deposited layer are parameters that are possible to adjust to optimise the mechanical and physical properties of said deposited layer.

Figure 3:
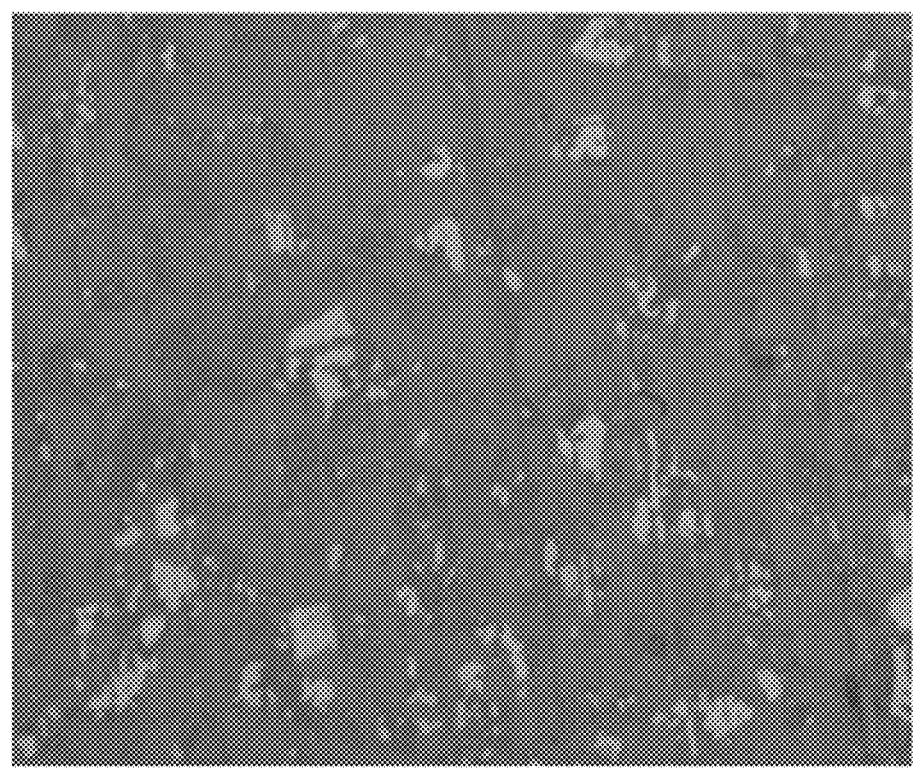
FIG. 3 is a micrograph illustrating the stripping after corrosion test of a substrate coated with a deposition not according to the invention.

In reference to FIG. 3, scanning electron microscopy observations are made on a substrate (S) having received a titanium sublayer then a deposited 20 nm thick carbon layer by being subjected to a bombardment of the ion assistance which is too strong (4 at % of residual oxygen). These observations show that after corrosion test at 0.8V, lacks of coating appear on the surface of the sample, in a significant number, and where the carbon layer is no longer present and the titanium sublayer is stripped at the bright spots. Despite the presence of a titanium sublayer (SC), a 20 nm thick carbon-based material (M) layer is not sufficient, such that the coated substrate (S) has optimum properties: it is necessary that the carbon-based material (M) layer, 20 nm thick, is deposited according to the criteria defined by the invention, namely that the oxygen content is suitable.

Another means of evaluating the quality of the covering and of the protection provided by the deposition to the substrate is a corrosion test in a saline medium. The sample is immersed in a 35 g/L sodium chloride solution, similar to seawater, at ambient temperature for 3 hours. A potential is applied to the sample from the balance potential E0 up to +0.8V, then the potential decreases down to −0.4V before returning to E0 (versus reference Ag/AgCl) at a scanning speed of 1 mV/s. The current is measured during 2 cycles.

Figure 4:
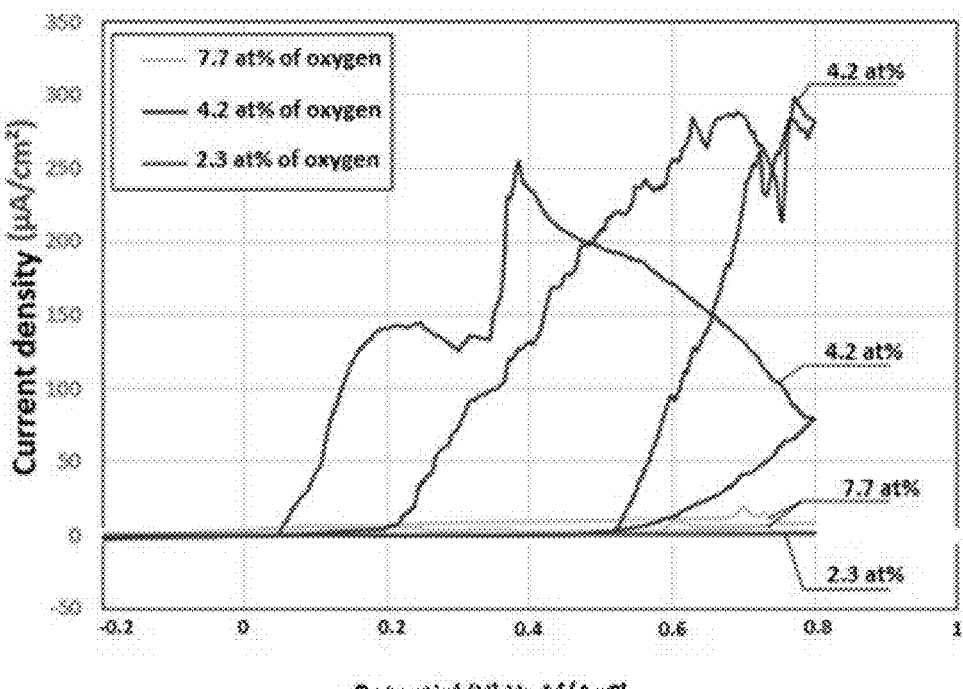
FIG. 4 is a cyclic voltammetry graph in a chlorinated environment led over carbon-based material layers deposited on stainless steel substrates according to the residual oxygen content, obtained during several series of tests.
Figure 5:
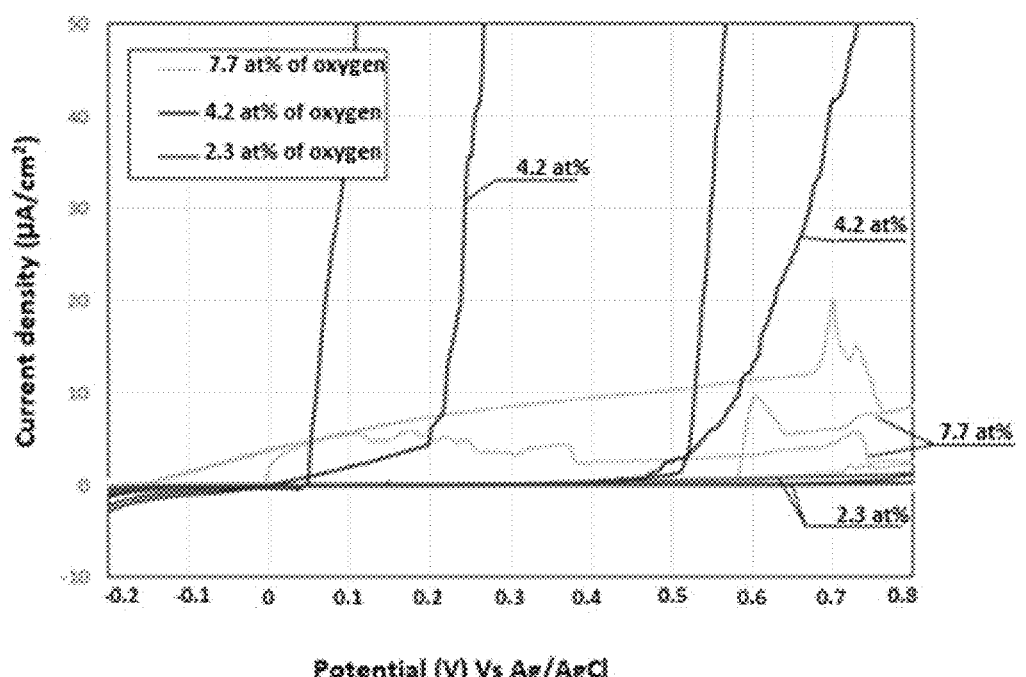
FIG. 5 is a detailed view of the graph of FIG. 5.

FIGS. 4 and 5 illustrate voltammetry graphs, obtained during such tests.

The three tested samples are substrates (S) in 316 L on which a carbon-based material (M) layer measuring 100 nm thick has been deposited:

the deposition of the first sample does not correspond to the invention, with an oxygen content of 8 at %;

the deposition of the second sample corresponds to the invention, with an oxygen content of 2 at %;

the deposition of the third sample does not correspond to the invention, with an oxygen content of 4 at %.

Although the deposition of the first sample does not correspond to the invention, as the layer thus deposited does not satisfy the requirements of the DOE, it however has a good adherence on the substrate (S). Such a layer can therefore serve as a carbon-based sublayer (SC), to then receive a carbon layer according to the invention.

Thus, the sublayer (SC) gives the part the expected features in terms of adherence of the layer (M), while said layer (M) gives the part the expected features in terms of resistance to corrosion and ICR.

In FIG. 4, it is seen that:

the first sample has a moderate corrosion current;

the second sample corresponding to the invention has a very low corrosion current;

the third sample has a sudden current increase when the potential exceeds 0.5V.

This corresponds to the corrosion by pitting of stainless steel in an NaCl medium, a well-known phenomenon. Coming from the test, the stainless steel foil is pierced in several points.

In FIG. 5, which is a detailed view of FIG. 4, it is observed that:

the first sample has a current increase, certainly limited, but which also corresponds to the pitting of the stainless steel;

the second sample corresponding to the invention has a very low current, since the anodic current is less than 1 μA/cm².

It can therefore be deduced that the carbon layers deposited with an oxygen content which is too high do not effectively protect the substrate (S) from corrosion, while the carbon layer deposited with an oxygen content in the range corresponding to the invention protects the substrate (S) optimally.

In particular, these corrosion resistance tests show that a carbon-based material (M) layer which is too bombarded, does not effectively protect the substrate (S) or the sublayer (SC), despite a thickness greater than 100 nm: local defects (lacks) in the layer appear in the corrosive medium. The subsequent stripping of the sublayer (SC) or of the substrate (S) in the corrosive medium causes their corrosion, and at least the entire salting-out in a metal cation solution that they release. In a cell, these are damaging to the durability of the membrane-electrode assembly, and therefore of the cell.

Other more severe corrosion tests have been performed, always with the aim of improving the service life of the electrochemical systems integrating the functionalised substrates (S). In these tests, the duration is brought to 1 hour and the potential at 1.4V and 1.6V (versus ref (Ag/AgCl)). These severe tests have been performed on different substrates (S) having received carbon layers of different thicknesses and comprising a sublayer (SC) or not.

The carbon consumption under these corrosion conditions is progressive:

the 20 nm and 50 nm carbon layers are fully consumed, and the substrate (S) or the metal sublayer (SC) is stripped over almost the entire surface of the substrates (S);

the 100 nm, 160 nm, or 300 nm layers are not fully consumed: the tested surface keeps a black appearance: a certain carbon deposition thickness is always present on the surface, which makes it possible to preserve the good surface conduction properties of the coating with a low ICR.

In this embodiment, it is therefore interesting to deposit a sufficient high carbon thickness to ensure a good resistance from the treatment to accidental overpotentials which could occur during the use of a cell, i.e. with dynamic operating conditions (with a cycling of the potential), or also a cycling for starting and stopping the cell (which lead to a greater cathode potential, or also the presence of air brought into contact with dihydrogen in the anodic medium upon start-up), etc.

Naturally, the maximum thickness of the carbon layer is limited by the cost of the treatment, linked to the necessary deposition duration.

The Applicant is then interested in the structure and in the chemical composition of compliant depositions.

Figure 6:
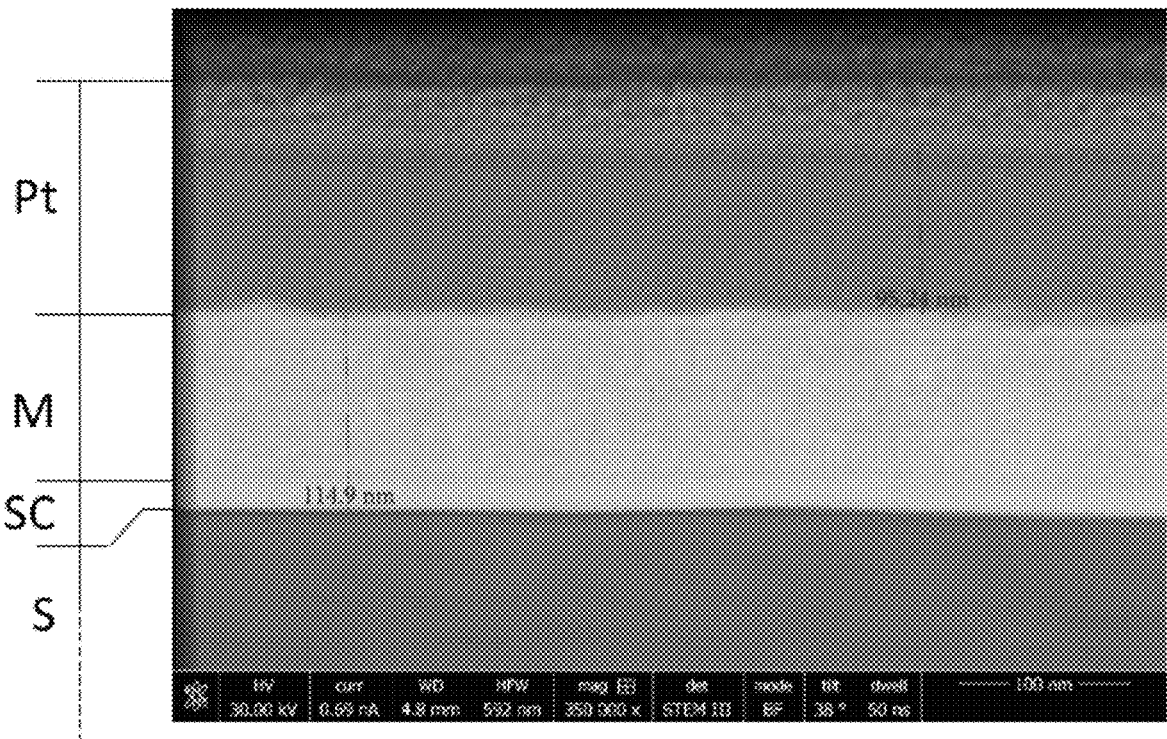
FIG. 6 is an observation of a cut made in electron microscopy by electron scanning of a substrate treated according to the method of the invention.

In reference to FIG. 6, a compliant deposition obtained according to the following parameters can be observed:

deposition on the substrate (S) of a carbon sublayer (SC), obtained by performing the magnetron sputtering like during the first test of table 1, having, as a result, an oxygen rate of 8%;

deposition of a dense carbon layer (M), obtained by performing the magnetron sputtering with an ion assistance according to the invention, i.e. giving an oxygen content≤3 at %.

In order to be able to perform the cut by ion beam, a platinum layer (Pt) in different forms is deposited on the part to protect it during the cut, and can be seen in FIG. 6, but this layer does not return into the scope of the method.

On this sample:

the carbon sublayer (SC) in contact with the substrate (S) measures around 17 nm thick;

the dense carbon layer (M) deposited on the sublayer (SC) measures around 98 nm thick;

the total thickness of the deposition therefore measures around 115 nm thick.

Figure 7:
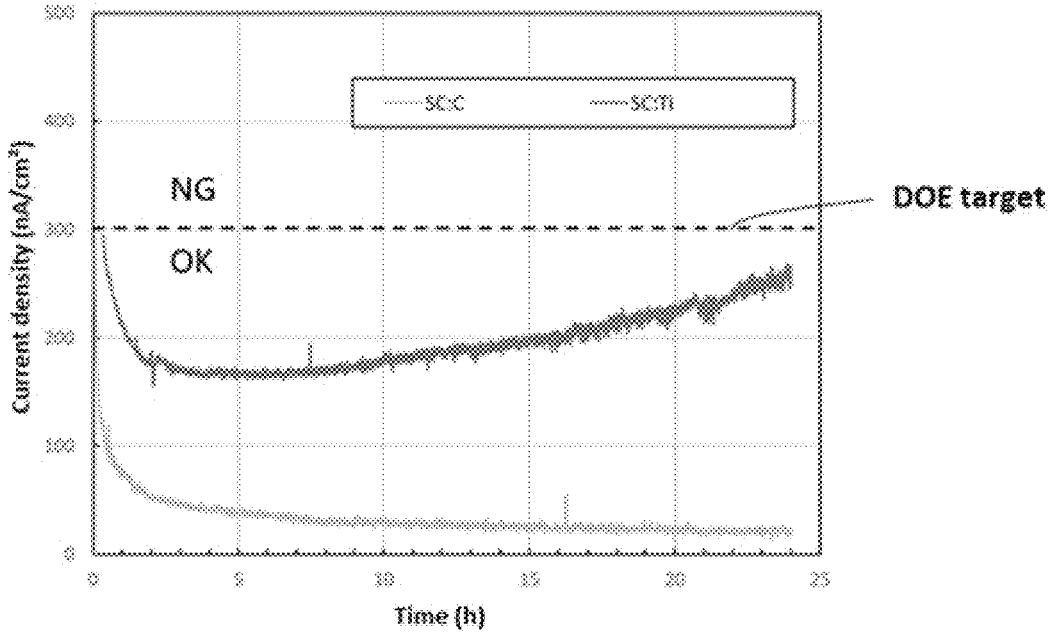
FIG. 7 is a graph illustrating the evolution of the corrosion current density of carbon-based material layers deposited on substrates over time, obtained during several series of tests.

In reference to FIG. 7, the Applicant has compared the evolution over 24 hours of the corrosion current density measured in a potentiostatic test at 0.8V (vs. Reference Ag/AgCl) for two samples having received a 100 nm carbon layer comprising 2 at % of oxygen, and corresponding to this embodiment. The first sample has received a carbon sublayer beforehand and the second sample has received a titanium sublayer beforehand.

The threshold of 300 nA/cm², based on the requirements of the DOE, appears on this graph. Beyond this threshold, the sample is not good (NG), and below, the sample is OK.

This test, the duration of which is extended, is an ageing test, similar to the abovementioned test, with the difference that in the present case, more specifically the evolution of the current density is represented over time.

It is observed that:

the first sample with carbon sublayer has a low corrosion current, and particularly that it decreases over time;

the second sample has a corrosion current which is a little greater, but particularly which tends to increase with time. This result suggests that the service life of the second sample will be lower than that of the first sample.

This test demonstrates that to obtain a further increased service life of a dense carbon layer (M) deposited according to this mode, a carbon sublayer is preferable to a metal sublayer.

However, a metal sublayer can have interests according to the type of substrate used:

if the substrate (S) is made of stainless steel, a metal sublayer made of titanium makes it possible, in case of degradation of the carbon-based material (M) layer, to create a passivation layer which guarantees that the stainless steel of the substrate (S) will not emit metal cations into the electrochemical system.

A particular embodiment can therefore comprise:

the substrate (S);

a first metal sublayer (SC) deposited on the substrate (S);

a second carbon-based sublayer (SC) deposited on the first metal sublayer (SC);

a carbon-based material (M) layer deposited on the second carbon-based sublayer (SC).

Chemical features by the method of dosing by energy-dispersive X-ray spectroscopy (EDX) of material (M) layers deposited on substrates according to the bias current and/or to the density of the plasma have then been performed. The interest of these characterisations is to be able to find, from a functionalised plate by deposition, if the latter has been performed according to parameters according to the invention.

Methods other than EDX can be considered, such as nuclear reaction analysis (NRA). EDX is a preferred method, as it is easy to implement. It must be noted that the contents to be detected are low, such that different measuring methods can provide slightly different results. A person skilled in the art who would be informed of the invention and of the necessity to obtain an oxygen content of 3 at % (value obtained by EDX according to the method described in this document) would know how to implement these measuring techniques, or any other measuring technique adapted for this purpose, which are known per se and usual in the technical field in question, in order to measure said content and ensure its compliance.

The EDX analysis is performed with the following parameters:

zone analysis with magnification×1000;

Acceleration voltage: 2.5 keV, in view of only integrating the oxygen from the functional carbon layer (M). A voltage which is too high biases the measurement by integrating the oxygen of an optional metal sublayer (SC) or optionally the substrate (S);

working distance: 10 mm;

analysis duration: 90-120 seconds;

probe current: 70-80 µA.

With the aim of improving measuring by EDX and of reducing the uncertainties of measurements inherent to the quantification of the residual oxygen rate being able to be very low, it is possible to calibrate the instrument via measuring the oxygen rate of a polymer, the chemical formula of which, i.e. the oxygen composition, is known.

To do this, different polymer samples, of different oxygen contents, are used (see table 2). They are first cleaned with ethanol, then introduced into a heat chamber at 90° C. for 24 hours to remove the water adsorbed on the surface, as well as the ethanol. They are then rapidly introduced in the MEB to avoid any contaminations with the outside air.

Two PMMA samples, of different chain lengths (which does not affect the O/C ratio) are tested, in order to show the repeatability and the consistency of the results.

TABLE 2

| | Theoretical composition (excluding H) | | |
| Polymer | Monomer | at % C | at % O |
| --- | --- | --- | --- |
| Polycarbonate PC | C16O3 | 84 | 16 |
| PMMA CN (high weight) | C5O2 | 71 | 29 |
| PMMA EX (low weight) | C5O2 | 71 | 29 |
| POM | CO | 50 | 50 |

Figure 8:
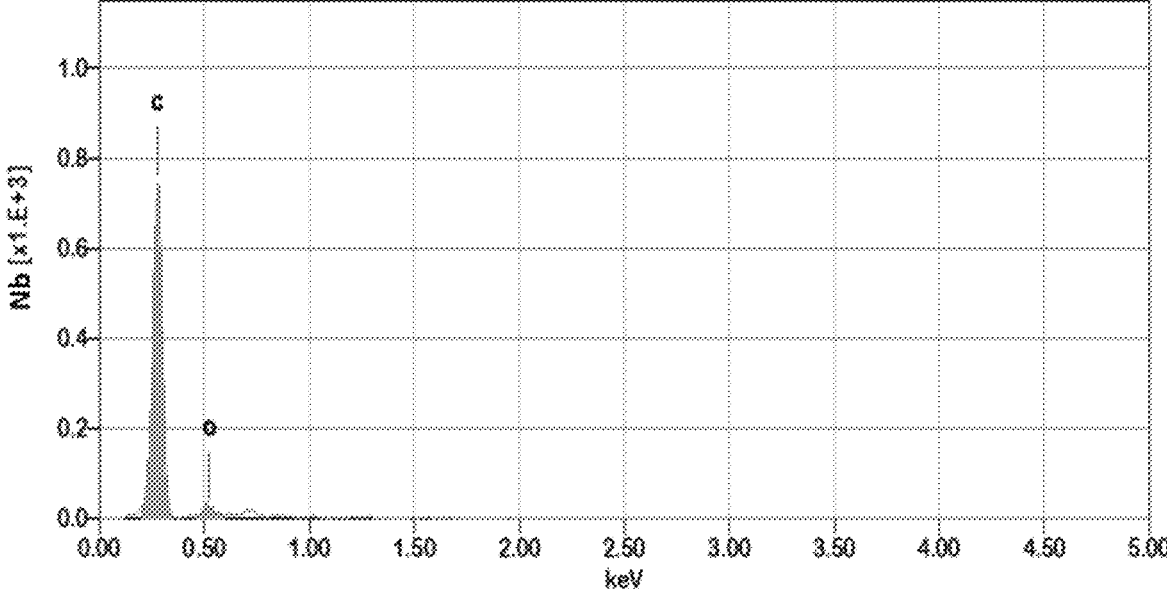
FIG. 8 is a spectrum graph obtained by EDX measurement.

An example of spectrum X obtained under the conditions mentioned is presented in FIG. 8.

Figure 9:
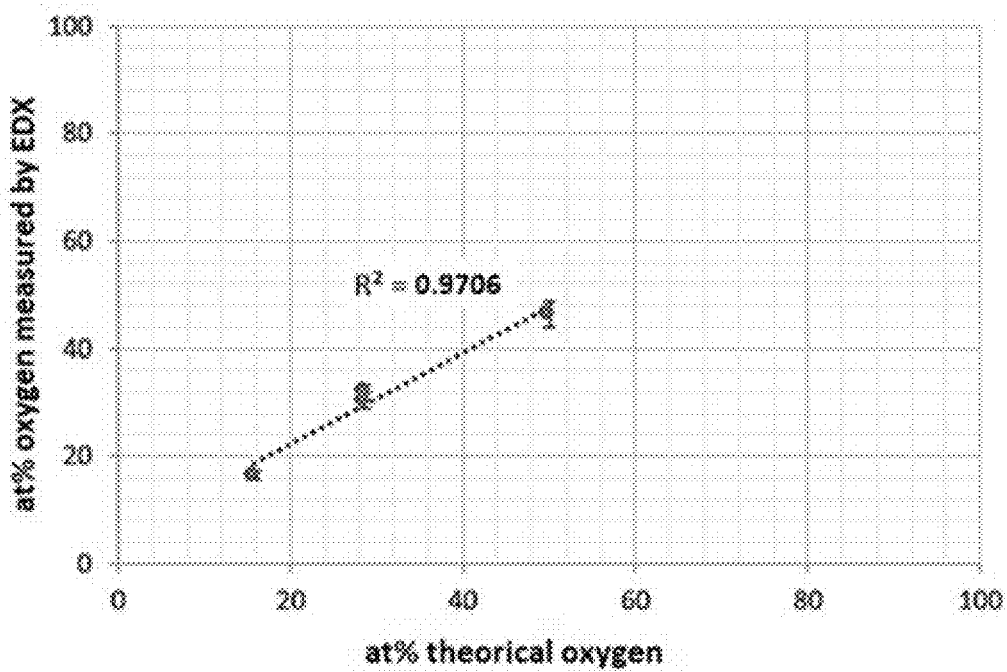
FIG. 9 is a calibration graph of the measurement by EDX.

In reference to FIG. 9, it is noted that the oxygen content measured is sufficiently close to the theoretical one and has a linear evolution: the calibration is therefore correct.

Figure 10:
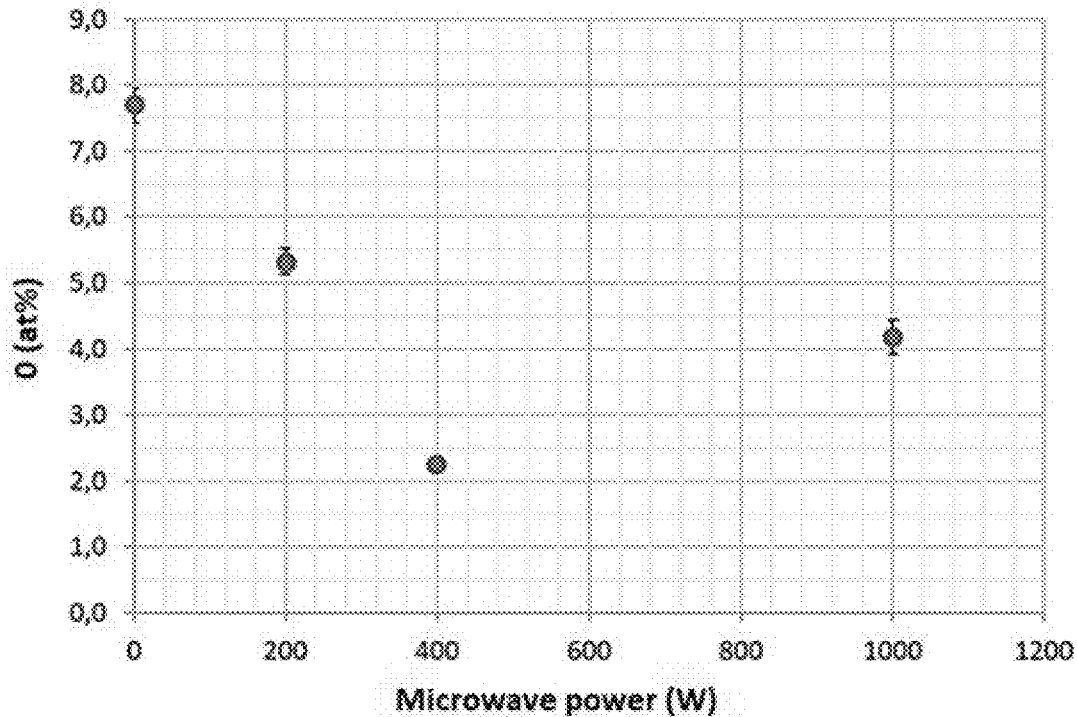
FIG. 10 is a graph illustrating the oxygen content of carbon-based material layers obtained during several tests, according to the intensity of the ion bombardment.

FIG. 10 illustrates a graph similar to the results described in Table 1. Expectedly, the carbon-based material (M) layer mainly comprises carbon, since the sputtered target is carbon-based. However, the residual oxygen rate varies according to the ion bombardment:

if the ion-assisted bombardment is not sufficient, the oxygen is incorporated in the growth deposition layer. On the samples obtained with this mode, the residual oxygen content is therefore greater than 3 at %.

when the bombardment is intensified, the oxygen content decreases and seem to pass through a minimum.

then, when the ion-assisted bombardment is too high, it is observed that the oxygen content increases again.

A functionalised plate in this mode therefore comprises, within its functional layer, an oxygen content less than or equal to 3 at %.

The functional layer can also comprise argon coming from ion assistance (or another noble gas, if a gas other than argon is used).

Figure 11:
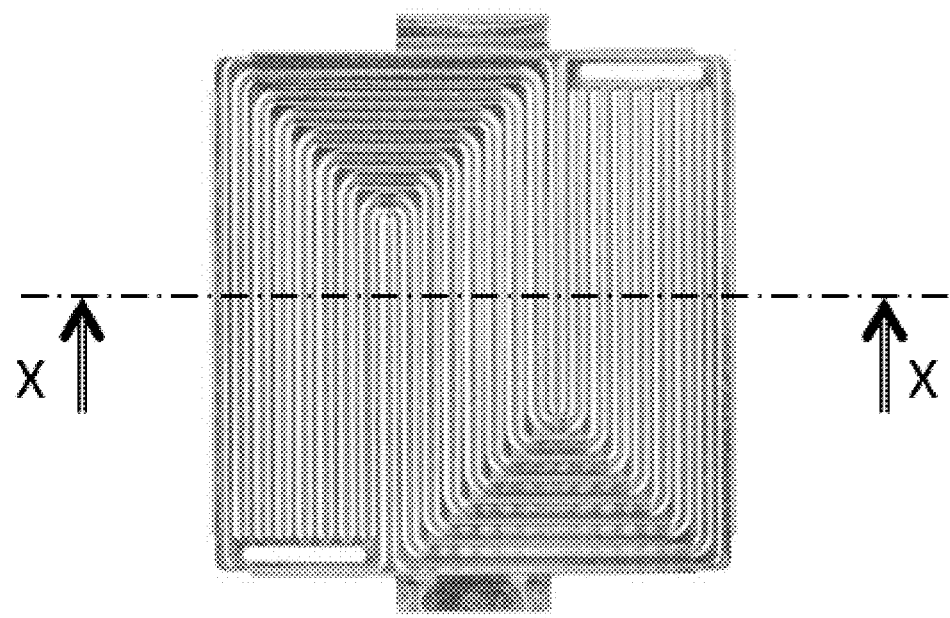
FIG. 11 is a photograph of a monopolar plate.

FIG. 11 illustrates a non-functionalised monopolar plate (60), on which the channels for conveying gases and for discharging water vapour can be distinguished, which have been shaped prior to the deposition of a functional layer.

Figure 12:
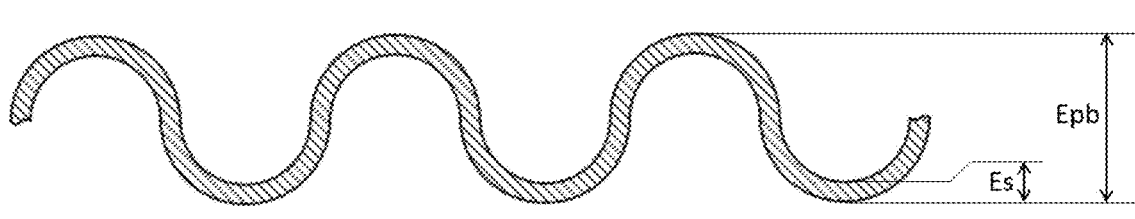
FIG. 12 is a partial representation of a cut of such a plate.

FIG. 12 is a diagram illustrating a partial view of a cut of such a bipolar plate (60). On this diagram, it is seen that the thickness of the substrate (Es) is less than the thickness (Epb) of the bipolar plate (60). Indeed, the thickness of the final plate (60) depends on the way in which this is shaped.

Starting with the unexpected observation of the relationship between a low residual oxygen rate in the carbon layer and a good resistance to corrosion, the Applicant has then sought to generalise the optimisation method implemented with magnetron cathode sputtering, such that it is compatible with other deposition techniques. Indeed, this makes it possible to be able to obtain carbon layers (M) which comply with the requirements of the fuel cells, whatever the deposition technique available.

It is reminded that when a vacuuming is proceeded within the technical field in question, nitrogen is totally discharged from the chamber (10), as it is adsorbed very slightly on the surfaces of the chamber (10), of the substrate (S) or in the target.

It is not sought to perform a reactive sputtering: the pumping system (20) does not introduce nitrogen nor other addition elements in the chamber (10), such as doping elements: the inner volume of the chamber (10), and therefore the deposited material (M) layer, have no nitrogen or other addition elements (excluding traces).

The material layer (M) does not contain hydrogen, nitrogen, or any other doping element, such as tungsten. In the technical field in question (chemistry of an amorphous material), by "does not contain" means a zero content, as a trace, or at the very least, a content less than 1 at %. In any case, it is sought to obtain a sufficiently low quantity such that these elements cannot give property to the deposited material (M) layer. None of these elements are intentionally added during the deposition.

However, despite the heating performed, a little adsorbed water still remains within the chamber (10): in practice, at the vacuum pressures of around $10^{-5}$ mbar implemented, steam almost remains within the chamber (10), insofar that it has no notable leakage. It is therefore not possible to avoid the presence of oxygen in the chamber (10) through the water, and this component can be found in the deposition during its formation. Oxygen can also be contained in the carbon-based target, as the graphite target is generally porous.

Oxygen is not easily removed from the deposited layer and its content depends on the ion bombardment conditions applied, which themselves are specific to the method used. Oxygen pollutes the deposition, as its presence has an impact on the compliance with respect to the requirements of the DOE.

The Applicant has therefore sought different methods for reducing the quantity of residual oxygen, below a threshold to be determined, such that the material (M) layer satisfies the requirements of the DOE.

Among the different compatible deposition and assistance modes, the Applicant has only given an example of a second embodiment, but it is understood that the invention resides in the implementation of the method described in claim 4.

In this second embodiment, a first phase consists of depositing a sublayer (SC) on the substrate (S) in order to guarantee the good mechanical strength of the carbon layer (M).

Then, the deposition is performed in pulsed DC mode for 40 minutes, in order to obtain a 100 nm carbon layer on the 2 faces of the substrate (S). During the deposition:
- a pulsed power of 3.2 kW is applied to the magnetron cathode,
- a potential of −100V in pulsed mode is applied to the substrate (S), and the frequency and the cyclic ratio of the pulsed mode are adjusted, by successive tests, in order to modify the residual oxygen content of the deposition.

The adjustment of the frequency and of the cyclic ratio of the pulsed mode making it possible to obtain carbon layers (M) comprising more or less residual oxygen.

Figure 13:
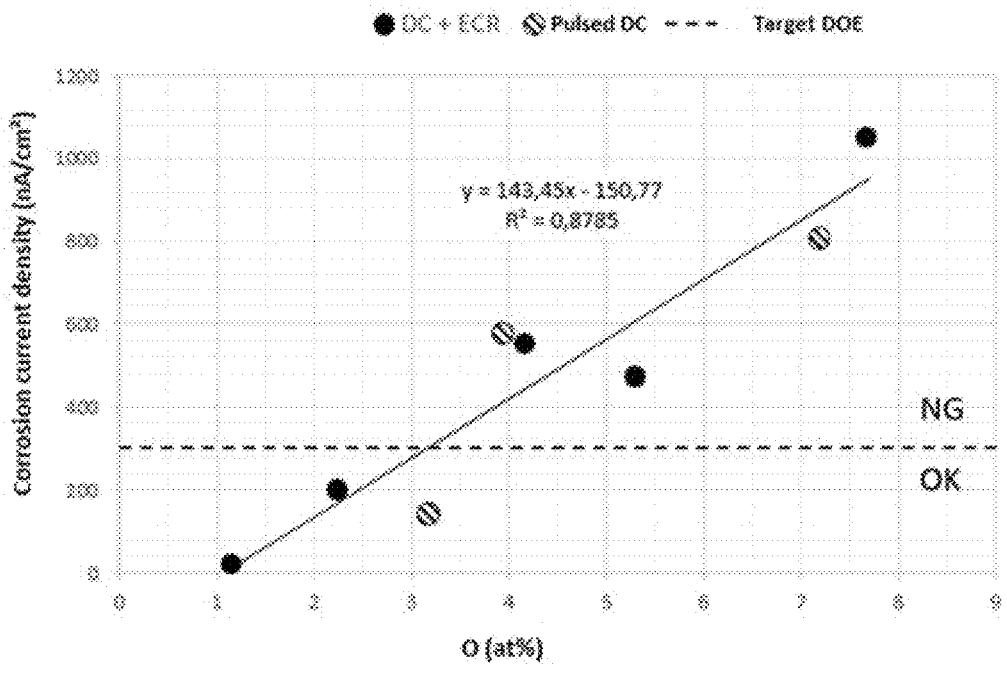
FIG. 13 is a graph illustrating the evolution of the corrosion current density of carbon-based material layers deposited on substrates over time, according to the oxygen content of these layers.

In reference to FIG. 13, the following have been measured for each test:

the corrosion current density, under the same conditions as above;
the residual oxygen content, by EDX;
the threshold to not exceed appearing: below, the sample is not good (NG).

It is observed on the graph of FIG. 13, that there is also a correlation between the residual oxygen content within the carbon-based material (M) layer with the corrosion current density of the material (M) layer, i.e. that there is a correlation between the oxygen content and the durability of the carbon layer (M), and this, whatever the deposition method used. It is also observed that the bias current, which leads to the oxygen contents similar to those obtained by assistance by microwave plasma, differs between the 2 methods.

This makes it possible:
first to confirm that the residual oxygen content within the layer (M) is actually correlated with the performance of the layer;
then, to affirm that the assistance of the different deposition techniques must be adjusted specifically to each method so as to obtain a residual oxygen content less than or equal to 3 at %, preferably 2 at %, and more preferably, 1 at %, measured by EDX.

In order to validate the results obtained with the first test, a second test measuring the ICR is performed, after an ageing test at 0.8V performed under the abovementioned conditions.

Figure 14:
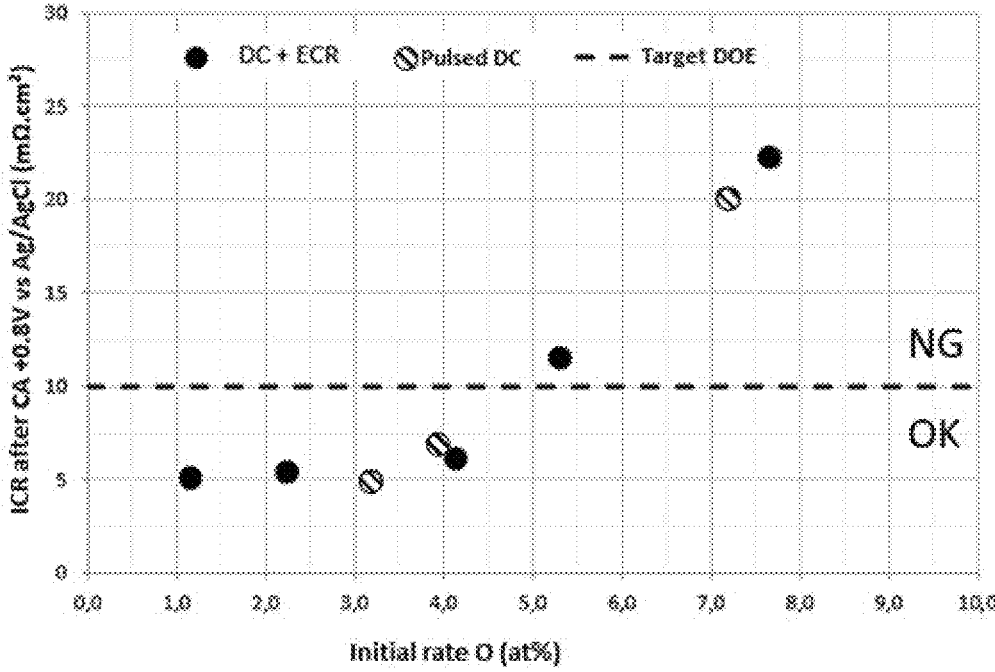
FIG. 14 is a graph illustrating the evolution of the interfacial contact resistance of carbon-based material layers deposited on substrate, according to the oxygen content of these layers.

In reference to FIG. 14, it is observed that among the different layers comprising a low residual oxygen rate, all the deposition techniques implemented satisfy the criterion of the ICR.

The Applicant has then performed a last series of tests of a third embodiment, wherein:
the deposition technique is that of the second mode, namely the magnetron cathode sputtering in pulsed DC mode;
the ion assistance is that of the first embodiment, namely a microwave plasma assistance.

In this third mode, the Applicant has adapted the parameters of the ion assistance with respect to the deposition being formed, by modifying the power of the assistance, until determining what the adjustments are, making it possible to obtain a residual oxygen rate which is less than or equal to 3 at %, within the carbon-based material (M) layer.

The ICR and corrosion resistance tests show that there again, with this new combination of deposition mode and ion assistance, it is the residual oxygen rate less than or equal to 3 at % which makes it possible to satisfy the criteria of the DOE.

The tests of the three modes are summarised in the table below.

TABLE 3

| Test # | Cathode mode | Pulse frequency (kHz) | P cathode (kw) | P microwave (W) | Bias voltage (V) | Current density PS (A/m2) | at % of oxygen | Corrosion current density (nA/cm²) | Initial ICR (mΩ · cm²) | ICR, after corrosion test (mΩ · cm²) | Performance |
|---|---|---|---|---|---|---|---|---|---|---|---|
| 1 | DC | / | 3.2 | 0 | 55 | 0.3 | 8 | 1050 | 4.1 | 22.2 | Insufficient |
| 2 | DC | / | 3.2 | 200 | 55 | 0.9 | 5 | 470 | 3.0 | 11.4 | Insufficient |
| 3 | DC | / | 3.2 | 400 | 55 | 2.0 | 2 | 200 | 3.6 | 5.3 | Excellent |
| 4 | DC | / | 3.2 | 1000 | 55 | 4.1 | 4 | 550 | 2.0 | 6.0 | Insufficient |
| 5 | Pulsed DC | 250 | 3.2 | 0 | 55 | 0.9 | 1 | 18 | 3.1 | 5 | Excellent |
| 6 | Pulsed DC | 100 | 3.2 | 0 | 55 | 0.5 | 7 | 800 | 7.1 | 20 | Insufficient |
| 7 | Pulsed DC | 250 | 5 | 0 | 100 | 1.2 | 4 | 580 | 1.7 | 6.8 | Insufficient |

TABLE 3-continued

| Test # | Cathode mode | Pulse frequency (kHz) | P cathode (kw) | P microwave (W) | Bias voltage (V) | Current density PS (A/m2) | at % of oxygen | Corrosion current density (nA/cm$^2$) | Initial ICR (mΩ · cm$^2$) | ICR, after corrosion test (mΩ · cm$^2$) | Performance |
|---|---|---|---|---|---|---|---|---|---|---|---|
| 8 | Pulsed DC | 250 | 3.2 | 0 | 100 | 1.2 | 3 | 140 | 2.8 | 4.9 | Excellent |
| 9 | Pulsed DC | 100 | 3.2 | 200 | 55 | 1.0 | 1 | 33 | 3.0 | 5 | Excellent |
| 10 | Pulsed DC | 100 | 3.2 | 600 | 55 | 2.5 | 4 | 400 | 2.5 | 6.5 | Insufficient |

This table makes it possible to summarise the invention, as it illustrates that whatever the deposition mode and whatever the ion assistance mode, what is important, is that the residual oxygen rate within the carbon-based material layer in a-C form is less than or equal to 3 at %.

A person skilled in the art will therefore know how to adapt the deposition parameters in view of minimising the residual oxygen rate and thus comply with the invention.

In conclusion, the method according to the invention makes it possible, whatever the deposition technique considered, by adjusting the parameters of the ion assistance and of the deposition so as to obtain a specific residual oxygen rate in the carbon-based material (M) layer, to find the most efficient deposition.

Various PVD methods according to the invention actually make it possible to functionalise substrates (S):

by providing low ICR values, not only before but after corrosion test;

by providing a good protection against corrosion, even over significant durations and high potentials;

the deposited layer having a good structural quality, since it does not have defects of the droplets type, for example;

the method being compatible with different types of parts such as sheets, monopolar or bipolar plates (optionally already welded and assembled), and constituted of different stainless steel-, titanium-, alloy-based materials of the Inconel® type, i.e. a nickel- chromium- and iron-based alloy.

Moreover, the method can be performed differently from the examples given without moving away from the scope of the invention, which is defined by the claims.

For example, it is possible to interchange the deposition modes and/or the assistance modes presented, or to combine several assistance techniques during the deposition, when these alternatives can be technically achieved, as illustrated in table 3. A person skilled in the art will know how to adjust the deposition conditions to the PVD techniques not described in this case, in view of obtaining the oxygen content range giving the optimal functional properties, for example by unbalancing type II magnetrons more or less strongly, and by combining them in a closed field, if the configuration of the deposition equipment permits this. It can also be considered to combine a pulsed DC sputtering technology with an auxiliary plasma source or with an unbalanced magnetron. In each case, the adjustment of the energy from the ions and from the flow of ions, specifically to each technology, will make it possible to target the suitable residual oxygen content.

Furthermore, the technical characteristics of the various embodiments and variants mentioned above can be combined in their entirety or only in part. Thus, the method and the installation (1) can be adapted in terms of costs, functionalities and performance.

It is, for example, possible to produce only one carbon-based sublayer (SC), only one metal sublayer (SC), or a carbon-based sublayer (SC) as well as a metal sublayer (SC). The thickness of the sublayer (SC) can be between 10 nm and 60 nm, for example, 30 nm.

The invention claimed is:

1. A metal part comprising a metallic substrate(S), having an outer surface coated with a carbon-based material (M) outer layer, wherein the carbon-based material layer:

is an amorphous diamond-like carbon ("DLC") and an "a-C" carbon;

comprises oxygen, in an amount of at most 3 at % of oxygen within the carbon-based material layer; and does not contain hydrogen, nitrogen, or doping elements, and wherein the substrate is a plate with a thickness between 10 μm and 1000 μm.

2. The metal part according to claim 1, comprising a carbon-based sublayer (SC) located between the substrate (S) and the carbon-based material (M), in contact with said carbon-based material (M), the carbon sublayer (SC) comprising between 3 at % and 15 at % of residual oxygen.

3. A plate of monopolar or bipolar type for a fuel cell, comprising the metal part according to claim 1.

4. A method for forming a metal part according to claim 1 by depositing, with ion assistance, a carbon-based material (M) outer layer on a metallic substrate(S), the deposition being done according to one of the techniques from among:

magnetron sputtering, continuously or pulsed, high power impulse magnetron sputtering (HiPIMS), unbalanced configuration magnetron sputtering, and optionally in a closed field, radiofrequency sputtering (RF sputtering), or any combination which can be done from these techniques;

said method comprising performing the deposition with an ion assistance, a level of which has been adjusted, such that the carbon-based material (M) layer contains oxygen, in an amount of, at most, 3 at % of oxygen within the carbon-based material (M) layer.

5. The method according to claim 4, wherein the material (M) deposited on the substrate(S) forms a layer called thin layer, having a thickness greater than or equal to 20 nm.

6. The method according to claim 4, comprising a prior step of depositing a metal sublayer (SC) on the substrate(S) intended to be located between the substrate(S) and the carbon-based material (M), in contact with said substrate(S), the material of the metal sublayer (SC) being chosen from among one or more of the following materials: chromium, titanium, zirconium, tantalum, or their alloys, as well as their nitrides and carbides.

7. The method according to claim 6, wherein the thickness of the metal sublayer (SC) is between 5 and 100 nm.

8. The method according to claim 4, comprising a prior step of depositing a carbon-based sublayer (SC) between the substrate(S) and the carbon-based material (M), in contact with said carbon-based material (M), and during which the level of the assistance is adjusted, such that the carbon-based sublayer (SC) contains between 3 at % and 15 at % of residual oxygen.

9. The method according to claim 8, wherein the carbon-based sublayer (SC) has an oxygen content gradient, which decreases from the substrate(S) in the direction of the carbon-based material (M) layer.

10. The method according to claim 8, wherein the thickness of the carbon-based sublayer (SC) is between 2 and 40 nm.

11. The method according to claim 4, wherein the substrate(S) comprises a stainless steel, titanium, a titanium alloy, or a nickel, chromium and iron-based alloy.

12. A plate of monopolar or bipolar type for a fuel cell, comprising the metal part according to claim 2.

13. The method according to claim 5, wherein the thin layer has a thickness of between 20 nm and 500 nm.

14. The method according to claim 5, wherein the thin layer has a thickness of between 80 nm and 120 nm.

15. The method according to claim 5, comprising a prior step of depositing a metal sublayer (SC) on the substrate(S) intended to be located between the substrate(S) and the carbon-based material (M), in contact with said substrate(S), the material of the metal sublayer (SC) being chosen from among one or more of the following materials: chromium, titanium, zirconium, tantalum, or their alloys, as well as their nitrides and carbides.

16. The method according to claim 15, wherein the thickness of the metal sublayer (SC) is between 20 nm and 40 nm.

17. The method according to claim 15, comprising a prior step of depositing a carbon-based sublayer (SC) between the substrate(S) and the carbon-based material (M), in contact with said carbon-based material (M), and during which the level of the assistance is adjusted, such that the carbon-based sublayer (SC) contains between 3 at % and 15 at % of residual oxygen.

18. The method according to claim 9, wherein the thickness of the carbon-based sublayer (SC) is between 10 nm and 30 nm.

19. The metal part according to claim 1, wherein the carbon-based material layer is the outermost layer of the metal part.

* * * * *